United States Patent
Tian et al.

(10) Patent No.: US 11,588,614 B1
(45) Date of Patent: Feb. 21, 2023

(54) FREQUENCY SEARCH AND ERROR CORRECTION METHOD IN CLOCK AND DATA RECOVERY CIRCUIT

(71) Applicant: EverPro Technologies Company Limited, Hubei (CN)

(72) Inventors: Jinfeng Tian, Beijing (CN); Yan Li, Beijing (CN)

(73) Assignee: EVERPRO TECHNOLOGIES COMPANY LIMITED, Wuhan (CN)

( * ) Notice: Subject to any disclaimer, the term of this patent is extended or adjusted under 35 U.S.C. 154(b) by 0 days.

(21) Appl. No.: 17/932,473

(22) Filed: Sep. 15, 2022

(51) Int. Cl.
| | |
|---|---|
| *H03D 3/24* | (2006.01) |
| *H04L 7/00* | (2006.01) |
| *H04L 7/04* | (2006.01) |
| *H03L 7/08* | (2006.01) |

(52) U.S. Cl.
CPC .......... *H04L 7/0087* (2013.01); *H03L 7/0807* (2013.01); *H04L 7/042* (2013.01); *H04L 7/048* (2013.01)

(58) Field of Classification Search
CPC ....... H04L 7/0087; H04L 7/042; H04L 7/048; H04L 7/0004; H03L 7/0807; H03L 7/093; H03L 7/0805; H03M 1/466
USPC ................................ 375/373–376, 326, 327
See application file for complete search history.

(56) References Cited

U.S. PATENT DOCUMENTS

| | | | |
|---|---|---|---|
| 6,826,247 B1 | 11/2004 | Elliott et al. | |
| 8,811,555 B2 * | 8/2014 | Asaduzzaman | ....... H03L 7/0807 398/155 |
| 9,054,689 B2 * | 6/2015 | Maruko | ................... H03L 7/085 |
| 10,644,868 B2 * | 5/2020 | Manian | ................. H04L 7/0004 |
| 11,411,574 B2 * | 8/2022 | Hung | .................... H03M 1/466 |
| 2004/0210790 A1 | 10/2004 | Moon et al. | |

(Continued)

OTHER PUBLICATIONS

First Office Action from corresponding Chinese Application No. 202111545993, dated Jan. 21, 2022, English translation attached.

(Continued)

*Primary Examiner* — Phuong Phu
(74) *Attorney, Agent, or Firm* — Grossman, Tucker, Perreault & Pfleger, PLLC

(57) ABSTRACT

A method of frequency search and error correction of clock and data recovery circuit, comprising: initializing a frequency search algorithm parameter; processing a frequency error parameter UP/DN signals according to the set algorithm parameter and starting the frequency search, in which, the algorithm accordingly counts the UP/DN signals. When a phase error signal transition occurs, a transition parameter JUMP is accumulated by 1, and an accumulation parameter SUM is obtained and is further judged that whether a frequency search result is to be output. Number of repeating times of verification and threshold parameters are set, accordingly a reset DCRL value is obtained to verifies a frequency locking result and outputs the result. The present invention improves accuracy of UP/DN pulse counting, increases stability and reliability of the frequency locking, avoids a false locking in the frequency locking, and prevents an excessive locking time in the frequency locking, overcomes error judgment of the frequency search caused by a random jitter, and correctly completes the frequency search and locking, avoids failure of the CDR caused by an error frequency locking.

6 Claims, 5 Drawing Sheets

(56) References Cited

U.S. PATENT DOCUMENTS

2010/0289593 A1    11/2010  Chen et al.
2014/0064423 A1*    3/2014  Chen ..................... H04L 7/0004
                                                          375/376
2014/0177771 A1     6/2014  Maruko et al.
2019/0372575 A1*   12/2019  Wu ......................... H03L 7/093

OTHER PUBLICATIONS

Chinese search report from corresponding Chinese Application No. 202111545993, dated Dec. 31, 2021, English translation attached.
Notification to Grant Patent from corresponding Chinese Application No. 202111545993, dated Feb. 9, 2022, English translation attached.

* cited by examiner

US 11,588,614 B1

FREQUENCY SEARCH AND ERROR CORRECTION METHOD IN CLOCK AND DATA RECOVERY CIRCUIT

PRIORITY INFORMATION

The Application Claims priority to Chinese patent application NO. CN202111545993.7 filed to Patent Office of the People's Republic of China on Nov. 17, 2021 with the invention title of "A method of frequency search and error correction in clock and data recovery circuit", which is incorporated herein by reference in its entirety.

TECHNICAL FIELD

The present invention relates to the field of integrated circuit IC design, especially a method of frequency search and error correction in clock and data recovery circuit.

BACKGROUND

With explosive growth of data volume in recent years, data transmission, storage and processing are facing greater challenges. The data rate is speeding up to 100 Gbps currently, and the data transmitted at high speed inevitably suffer from various interference and noises in the medium, so the data quality is getting worse, leading to high bit error rate, even the data is completely destroyed. Therefore, it is necessary to insert a certain amount of clock and data recovery circuit in data transmission channel to prevent the data from deteriorating to an unrecoverable extend, thereby improving data quality and facilitating long-distance transmission.

A clock frequency recovery circuit is a key module in high-speed communication. For normal locking and sampling data, it is required that a frequency detector, FD should firstly find a clock frequency corresponding to a data rate, and then regulate phases to align a clock sampling edge with the middle of the data. Some theoretical frequency locking methods were put forward in many previous studies and papers, wherein, two common frequency test proposals are described as follows:

The prior art I is disclosed in a paper published in JSSC in 2011, named "A 0.5-to-2.5 Gbps Reference-Less Half-Rate Digital CDR with Unlimited Frequency Acquisition Range and Improved Input Duty-Cycle Error Tolerance", wherein, a method of determining a clock is described. The method is realized on the basis of the relationship between the number of edges of an input random data and a Data Rate, DR, is in a relatively fixed manner within a long statistical time. Specifically, counting the number of rising edges by a counter within a certain period, and taking a most significant bit of the counter to represent a harmonic frequency of the data rate, and then comparing it with a crossover frequency of the digital controlled oscillator (DCO) to determine the speed of the current DCO frequency, in short, counting the number of the edges within a long time and judging the DCO frequency by comparing the two statistical data.

Because the number of the edges is related to a data pattern, different data patterns at the same data rate will lead to different number of the edges counted by the counter, which is mapped to the frequency error, and the counter needs to operate for a long time for achieving certain frequency accuracy, namely, the longer the counting period, the smaller the frequency error. However, it takes a long time to lock, thereby causing the requirements in some applications are not satisfied.

Therefore, prior art II is disclosed. The prior art II is described in a paper published in JSSC in 2016, named "A 4-to-10.5 Gbps Continuous-Rate Digital Clock and Data Recovery with Automatic Frequency Acquisition", wherein, another method of determining clock is described. The principle of the technology is that the counter is used to count the number of early/lagged pulse (E/L) within a period that is equal to a difference of the clock rates between the input data and the current digital controlled oscillator, and the number reflects a phase change speed caused by a rate difference, namely, the frequency error. The smaller the value of the counter, the larger the current rate error, and the larger the value of the counter, the smaller the equivalent rate error. When value of the counter exceeds one certain threshold, the frequency is regarded to be locked. This solution overcomes the effect of the data pattern on error to some extent, but the E/L counting result will be mis-judged with the data jitter, so as to further affect the frequency error, and the large rate error is caused by the false locking of a fractional harmonic, for example, the data rate is equal to two-thirds of frequency, and a following phase locking loop fails to converge, finally, the locking speed will be reduced if the frequency is gradually scanned from the lowest.

Therefore, in actual applications, (1) there is a problem with long locking time, thereby not satisfying with requirements in some standards for locking time; (2) there is a problem with when a high-speed PRBS signal has jitter points, the follow-up phase locking process fails to align the phases because the frequency is frequently locked to other frequency points due to existence of randomness and jitter of the data and different frequency points are observed after each false locking, with a certain randomness; (3) there is a problem with that the system is easy to enter false locking when input is at a rate of fractional harmonic, and the final locking position cannot be reached, thereby resulting in early ending of the frequency locking process, and failure of correct implementation of the data sampling. Above three technical problems are required to be solved urgently.

SUMMARY

The invention is intended to provide a method of frequency search and correction in clock and data recovery circuit: for this purpose, a series of improved algorithms are introduced to overcome various problems occurred in above actual applications to ensure that the correct frequency results can be obtained through the frequency search.

The application puts forward a method of frequency search and error correction in clock and data recovery circuit, comprising following steps:

setting search algorithm parameters step S1, initializing frequency search algorithm parameters, which including a digital control bits DCRL used for starting search, a step size STEP used for frequency search, a transition parameter JUMP used for control condition of an internal state machine, a timer duration TIMER of a state machine, a period parameter PERIOD and a accumulation parameter SUM;

searching frequencies step S2, processing characteristic signals of frequency error, UP/DN, according to the set algorithm parameter and starting to search the frequency, wherein, an UP Counter&Timer or a DN Counter&Timer is selected to time according to the UP/DN value, when a phase error signal transition occurs, the JUMP is increased by 1, ensure the counting of the UP or DN is accumulated in one period in combination with the JUMP, the jump parameter threshold, the PERIOD and the period parameter threshold to acquire the SUM and further determine whether outputting the frequency search result;

verifying and outputting the frequency locking result step S3, setting number of repeating times of verification and threshold parameters and acquiring the resetting DCRL value in combination with the search result of output frequency and the setting OFFSET, and then repeat the step S2, and determine whether the frequency locking result is correct and then output the result.

Furthermore, the UP/DN is acquired by following methods: using clocks CLK0/1/2/3 to sample a data edge or a data center of an input data DIP/DIN to acquire a corresponding sampling result Edge0, Data0, Edge1 and Data 1, and carrying out an exclusive-or operation on synchronized above sampling results to acquire the UP/DN.

Furthermore, if value of the Data 0 is different from that of the Edge 1, and value of the Edge 1 is the same as that of the Data 1, a high-level UP signal and a low-level DN signal are output; if value of the Data 0 is the same as that of the Edge 1 and value of the Edge 1 is different from that of the Data 1, a low-level UP signal and a high-level DN signal are output.

Furthermore, in the step S2, a phase error signal transition is determined by transitioning from UP/DN with continuous pulse to DN/UP with continuous pulse or transitioning from DN/UP with continuous low level to UP/DN with continuous low level, or according to change of the relative number of the UP/DN pulses in the UP/DN data.

Furthermore, in the step S2, when the JUMP is greater than or equal to a jump parameter threshold JUMP_TH, the PERIOD is increased by 1, and determining whether the PERIOD is greater than or equal to P_TH, if the PERIOD not satisfied with that the PERIOD is greater than or equal to the P_TH, another sub-state is jumped to, when the PERIOD is not equal to zero, the accumulation on UP/DN pulses is started, and continuous counts of UP/DN for a period of time, NUM_DN or NUM_UP is accumulated into the SUM; when the PERIOD is greater than or equal to the P_TH, the SUM is judged; if the SUM is smaller than the accumulation parameter threshold SUM_TH the DCRL is increased by the STEP, retesting once with a further converged; when the SUM is greater than or equal to the SUM_TH, outputting the frequency search result.

Furthermore, in the step S2, when the PERIOD is greater than or equal to the P_TH, the SUM is judged, when the SUM is smaller than the SUM_TH, the DCRL value is increased by the STEP, when the SUM is greater than or equal to the SUM_TH, outputting the frequency search result Furthermore, in the step S2, a state transition counter is comprised, the state transition counter starts to count after transitioning to another sub-state, the sub-state is forced to transition once time if timeout, meanwhile the PERIOD is increased once, or the sub-state is not forced to transition, only the PERIOD is increased once.

Furthermore, in the step S3, the OFFSET is increased or decreased according to the output frequency search result, thereby obtaining the DCRL.

Furthermore, in the step S3, setting a parameter RETRY_NUM indicating counts at error correction stages, a parameter RETRY_PASS indicates counts success at error correction stages, after DCRL changes, performing the frequency search according to the UP/DN, restarting accumulation of the SUM, and determining whether the SUM is greater than or equal to the SUM_TH, if the SUM is greater than or equal to the SUM_TH, the RETRY_NUM and the RETRY_PASS is added by 1, respectively; if the SUM is smaller than the SUM_TH, the RETRY_NUM is added by 1, and the RETRY_PASS keeps unchanged; the accumulation process of SUM in the step S2 is repeated as long as the RETRY_NUM is smaller than a threshold for counts on error correction stages, RETRY_TH, when the RETRY_NUM is equal to the RETRY_TH, determining if the current RETRY_PASS is greater than or equal to a threshold PASS_TH. If the RETRY_PASS is less than the PASS_TH, the previous locking in the step S2 can be determined as the false locking, and then returning to the step S2 and searching again after DCRL is increased by STEP. If the RETRY_PASS is greater than or equal to the PASS_TH, the locking at this moment is the real frequency locking.

The present invention provides a method of frequency search and error correction algorithm, which can shorten the frequency search time and improve the compatibility of the whole circuit, avoid the false locking of random frequency and the error state in operation of CDR, improve the resistance against external disturbances and resolve locking problems caused by the fractional harmonics to some extend by adding relevant parameter setting, which is equivalent to increasing locking range of the frequency lock loop FLL and extend usability of the circuit.

DETAILED DESCRIPTION

The present invention will be explained in detail below with reference to the accompanying drawings and embodiments. It should be understood that specific embodiments described here are only used for explanation of the present invention instead of limitation to it. Moreover, it should be further noted that, for easiness of description, the accompanying drawings only illustrate a part of the structure related to the present invention, instead of the whole structure thereof.

Figure 1:
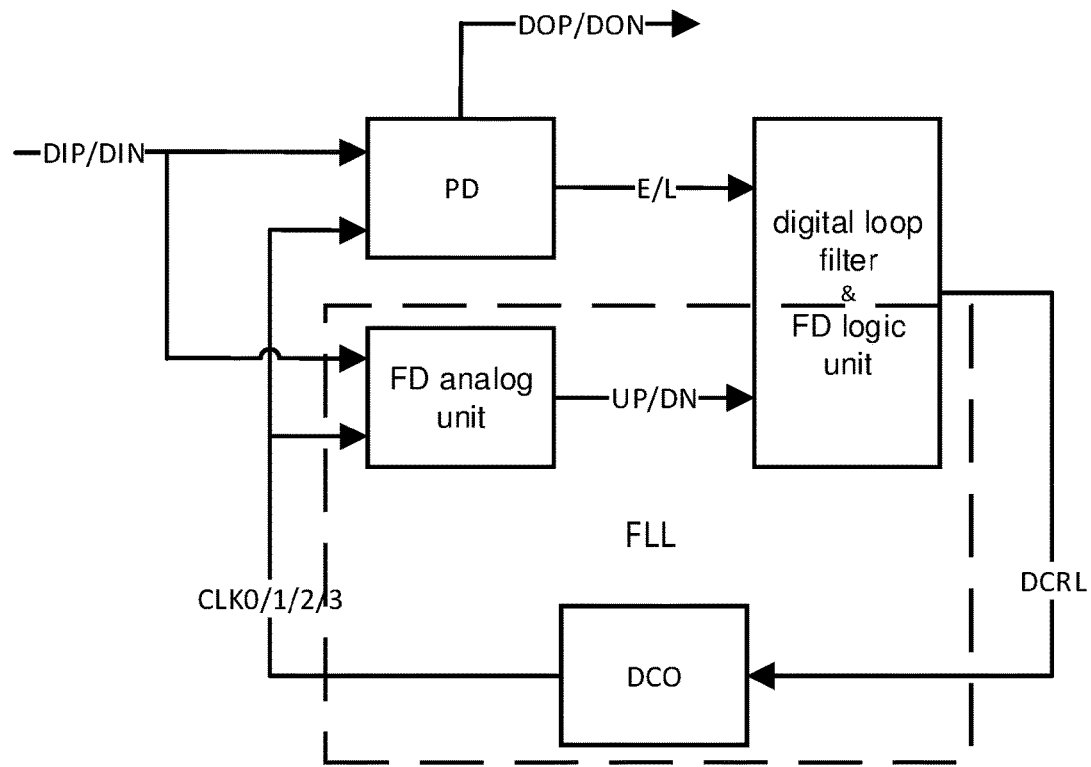
FIG. 1 is a block diagram of a clock and data recovery circuit of the present invention.

FIG. 1 is a block diagram of a clock and data recovery circuit according to the present invention. The clock and data recovery circuit, CDR, is used for clock signal recovery in random DIP/DIN with noise, and using the recovered clock signal to sample the DIP/DIN to acquire a high-quality recovery signal. In order to recover the clock, the frequency locking loop, FLL, is required to use to acquire the accurate clock frequency.

In general, a random DIP/DIN and the clocks CLK0/1/2/3 of DOC form a phase-lock loop through a phase detector, PD, so that the whole CDR completes locking and normally samples the signals, and the high-quality data after sampling are sent to other circuits through DOP/DON. However, the phase detector PD fails to work correctly when a large frequency error occurs between the input signal and the clock signal because the PD operates in a limited range. As a result, before operation of the PD, sending the random DIP/DIN and the CLK0/1/2/3 of DCO to pass through a frequency detector analog unit FD-Analog to acquire the UP/DN, and sending the UP/DN to a frequency detector logic unit FD-Logic for processing, and determining whether the current frequency error matches locking requirement of the PD. If the current frequency error matches locking requirement of the PD, open the PD module to lock the phase (the control signal is not shown in FIG. 1). If the current frequency error fail to match locking requirement of the PD, the FD logic unit will adjust the clock frequency output by the DCO to reduce the frequency error and perform next judgment.

Figure 2:
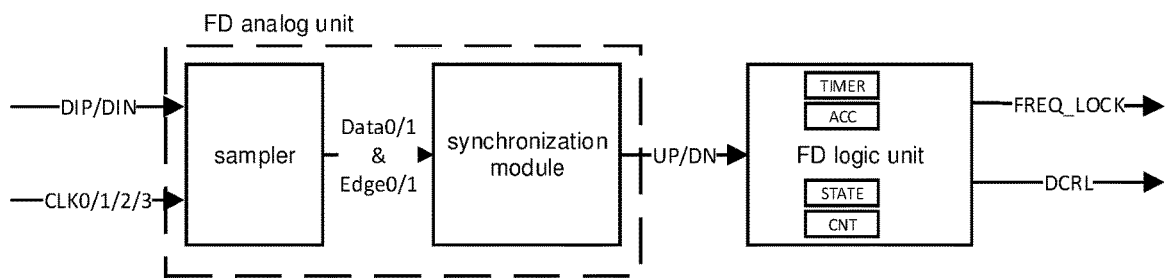
FIG. 2 is a block diagram of the FD analog unit and the FD logic unit of the present invention.

Specifically, the method of frequency search and error correction in a clock and data recovery circuit of the invention is implemented by the FD analog unit and the FD logic unit. These units perform a frequency test, the structure is shown in FIG. 2. The FD analog unit comprises a slicer and a synchronization module with retiming and XOR function. The FD logic unit comprises a control state machine STATE, a judging condition counter CNT, an input accumulator ACC, and a timer duration TIMER, wherein, the STATE controls the ACC to operate according to the results from the CNT, and judges if matching the frequency locking condition based on result of the ACC and outputs corresponding results, and the ACC is limited by the TIMER in process.

Figure 3:
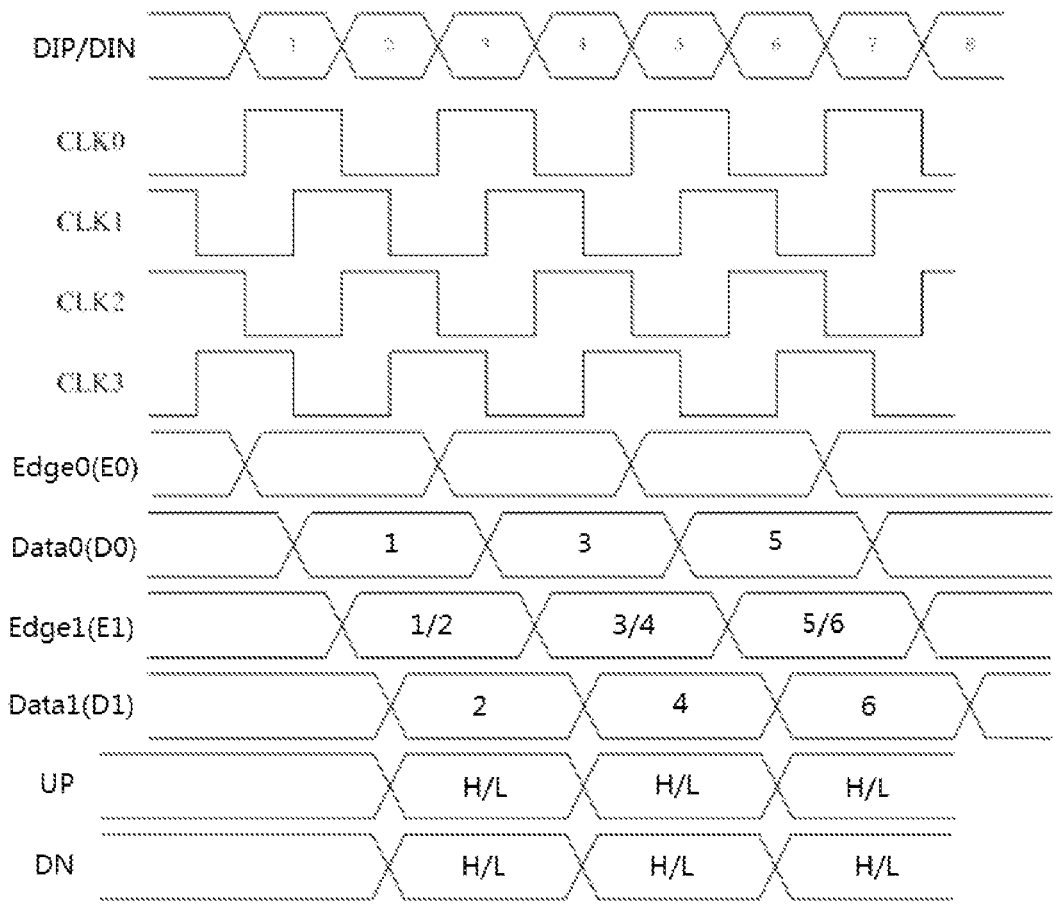
FIG. 3 is a diagram of sampling of the FD analog unit.

The present invention principle is shown as FIG. 3. In the FD analog unit, the clock CLK0/1/2/3 is used in the Slicers to sample the data edge or the data center of the input data DIP/DIN to obtain the corresponding sampling result Edge0, Data0, Edge1 and Data1. These sampling results are sent to the synchronization module (Retiming & XOR) to synchronize, thereby aligning all results align to one certain clock edge, and then use the XOR to process these signals to acquire the characteristic signal UP/DN of frequency error.

As a specific embodiment, taking Data 0, Edge 1, and Data 1 as an example. If the value of the Data 0 is different from that of the Edge 1 and value of the Edge 1 is the same as that of the Data 1, a high-level (H) UP signal and a low-level (L) DN signal are output; if value of the Data 0 is the same as that of the Edge 1 and value of the Edge 1 is different from that of the Data 1, the low-level (L) UP signal and the high-level (H) DN signal are output. In a real implementation, different sampling signals can be selected as required, or different UP/DN rules be specified.

Figure 4:
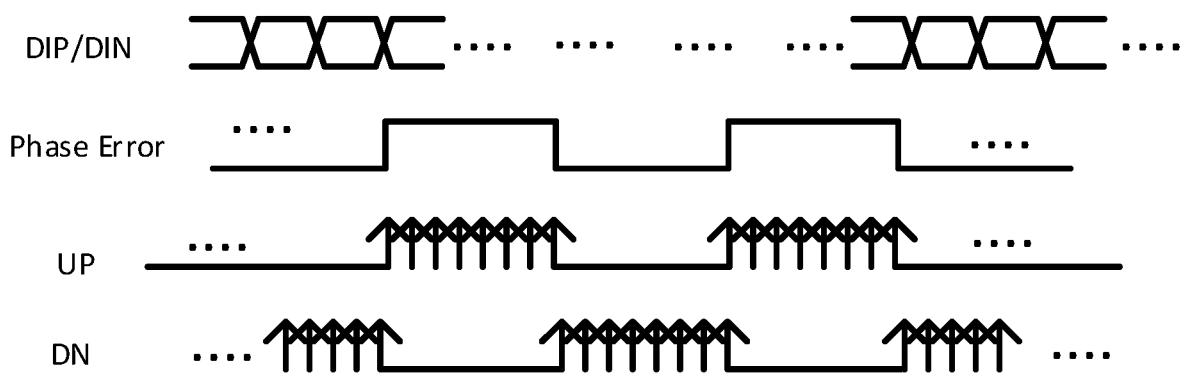
FIG. 4 is a diagram between the phase difference and the UP/DN signal.

Relatively, the phase difference must be a period signal due to asynchronization of the period and the phase when there is the frequency difference between the input signals and the clock signals. FIG. 4 is a diagram of the phase difference and the UP/DN signal. When phase of the DIP/DIN is ahead of phase of the clock signal, according to the working principle of the FD analog unit mentioned above, the UP signal will be at high-level continuously while the DN signal will be at low level for a long time; accordingly, the DN signal will be at high level continuously while the UP signal will be at low level for a long time according to the working principle of the FD analog unit mentioned above, when phase of the DIP/DIN lags behind phase of the clock signal. The number of the high-level and low-level pulses are served as the characteristics of the frequency error, presenting degree of the frequency error to certain extend.

Such a group of the UP/DN are sent to the FD logic unit to be processed by the frequency search and correction method described by the present invention to correctly judge the degree of frequency error and state of frequency locking, or accordingly adjust the clock frequency of DCO.

Figure 5:
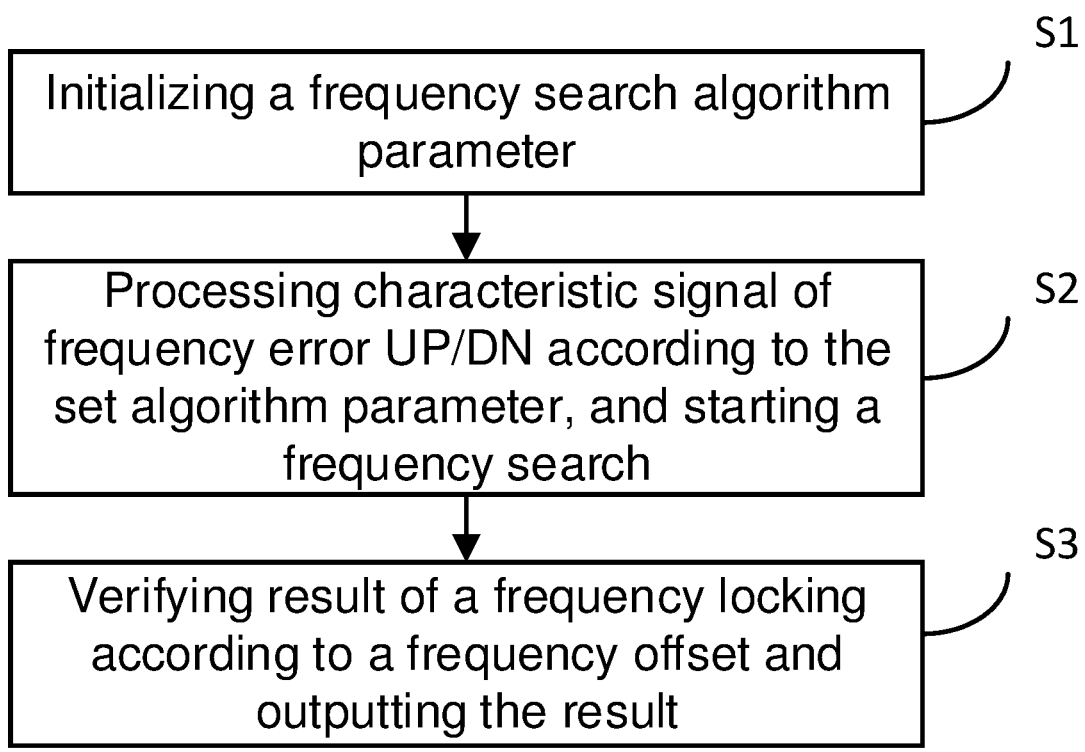
FIG. 5 is a flowchart of a method of frequency search and correction in a clock and data recovery circuit of the present invention.

FIG. 5 shows a flowchart of a method of frequency search and correction in a clock and data recovery circuit provided by the present invention, comprising initialization, frequency search and frequency verification.

Setting search algorithm parameters step S1, initializing the frequency search algorithm parameters, which including a digital control bits DCRL used for starting search, a step size STEP used for frequency search, a transition parameter JUMP used for control condition of an internal state machine, a timer duration TIMER of a state machine, a period parameter PERIOD and an accumulation parameter SUM, thereby adjusting the speed of the frequency locking according to actual circuit parameters of the whole CDR and different requirements of outside application conditions. The DCRL which indicates digital control bits for frequency of a digital-controlled oscillator, DCO, the greater the DCRL, the higher the clock frequency output by the DCO, is set to 0, so that the DCO starts to search from the minimum frequency, and it is necessary to ensure the minimum frequency of the DCO at this moment is lower than the rate of the input data; and then, the adjustment frequency of the DCRL should be increased by the STEP, wherein, the STEP can be configured by parameters. Specifically, such parameters as the JUMP, the TIMER, the PERIOD, and the SUM are initialized to 0.

Figure 6:
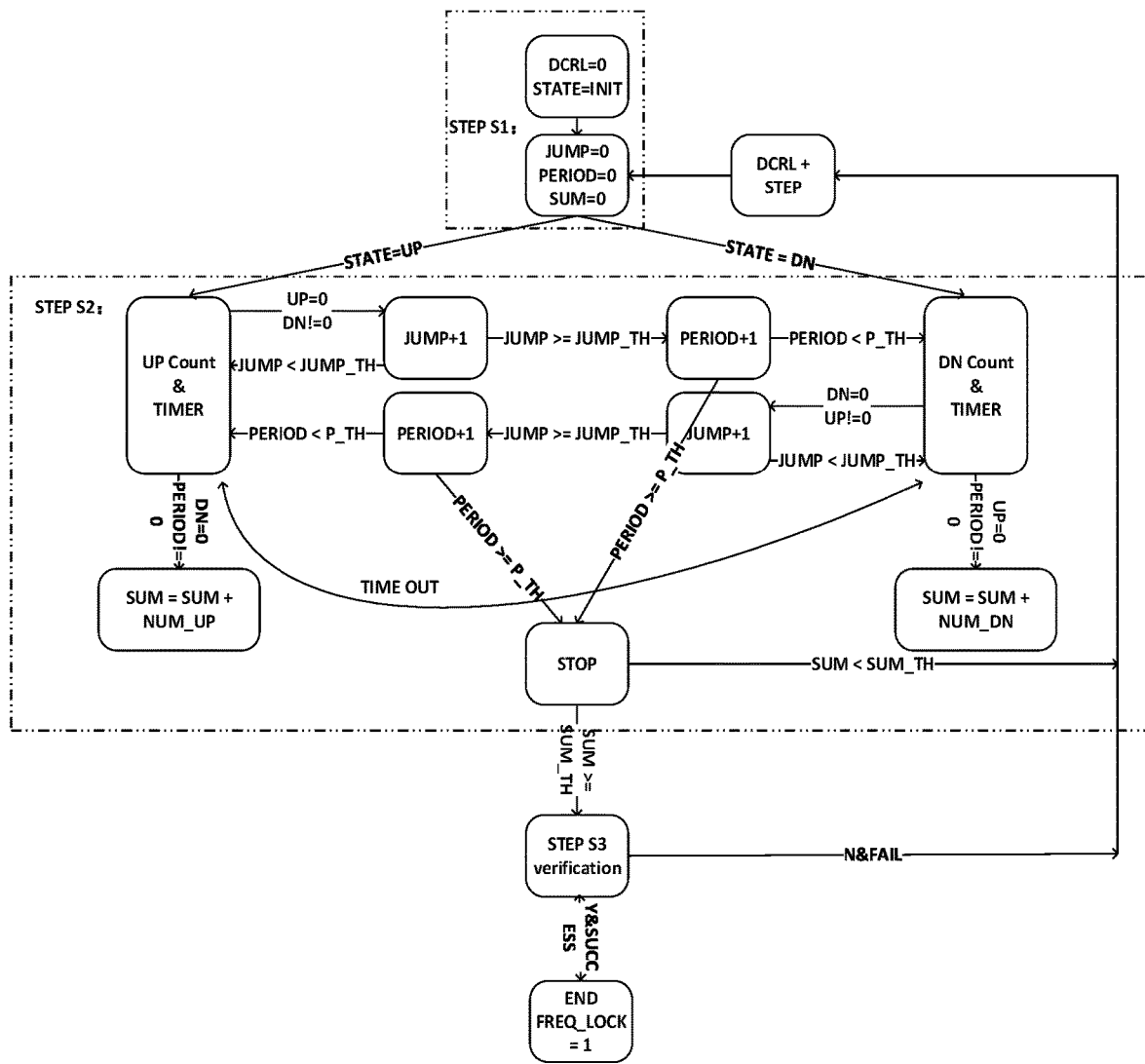
FIG. 6 is a flowchart of a method of the frequency search in a clock and data recovery circuit of the present invention.

Searching frequencies step S2, processing characteristic signals of frequency error, UP/DN, according to the set algorithm parameter and starting to search the frequency FIG. 6 is a flowchart of a method of frequency search in a clock and data recovery circuit of the present invention. Specifically, determining if the corresponding sub-state is entered according to the UP/DN, namely, an UP-Count&Timer or a DN-Count & Timer starts to time. Because the PERIOD=0 at this moment, it is suggested that this moment cannot be guaranteed to be a starting position of conversion of a phase error signal, and the UP/DN at this moment cannot be accumulated as a valid data. Only when a phase error signal transition that is transitioning from UP/DN with continuous pulse to DN/UP with continuous pulse, or transitioning from DN/UP with continuous low level to UP/DN with continuous low level occurs, the JUMP is increased by 1; when the JUMP is greater than or equal to a jump parameter threshold JUMP_TH, the PERIOD is increased by 1, and determining whether the PERIOD is greater than or equal to a period parameter threshold P_TH. If the PERIOD is greater than the P_TH, it is not required to perform follow-up UP/DN signal counting and directly enter to SUM judgement, if the PERIOD is not satisfied with that the PERIOD is greater than or equal to the P_TH, the state machine jumps to another sub-state. In the sub-state, because the PERIOD is not equal to zero, the accumulation on UP/DN pulses is started, and recording the number of corresponding pulses, for example, NUM_DN records the number of the DN pulse appears, continuous counts of UP/DN for a period of time, NUM_DN or NUM_UP is accumulated into the SUM.

The UP/DN will be accumulated all the time if the JUMP does not match the jump condition. Because the input data in actual application is random and jitters greatly, the JUMP may take a long time to match the jump condition or never match the jump condition, thereby resulting in SUM error. According to FIG. 4, jumping must occur at a certain time because of inevitable periodicity of phase error signal.

In order to ensure jumping of the sub-state, the state transition counter is designed, and its time parameter can be configured. After entering the sub-state, open the state transition counter, and the sub-state is forced to transition once time if time out, meanwhile the PERIOD is increased once. Or, the sub-state is not forced to transition after the state transition counter times out, while only the PERIOD is increased once, so as to control the counting time of each sub-state.

Only when the PERIOD is greater than or equal to the P_TH, the SUM is judged. When the SUM is smaller than the SUM_TH, which suggested that the frequency error at this moment is great and the requirements of the phase locking loop cannot be matched, the DCRL is increased by the STEP, retesting once with a further converged frequency error. When the SUM is greater than or equal to the SUM_TH, which suggested that the result of the frequency search is initially judged to be correct, then the result is output. At this moment, the judgment is based on the periodicity of the phase difference. The smaller the frequency error, the longer the period of the phase difference, and the more the UP/DN pulses in the same period, so that the accumulative pulses will continue to increase until exceeding the threshold SUM_TH.

It should be noted that, for the condition that the JUMP is increased by 1, it is not required that UP/DN has no pulses at all. Whether the JUMP is necessary to increase by 1 can be determined according to the UP/DN pulses in the UP/DN data; SUM counting is just one implementation method, and the UP/DN can be counted separately, or each PERIOD can be counted separately according to change of the PERIOD.

Verifying and outputting the frequency locking result step S3, carrying out the frequency error correction according to the frequency search result in the step S2, and re-verifying the correctness of the frequency search result.

Figure 7:
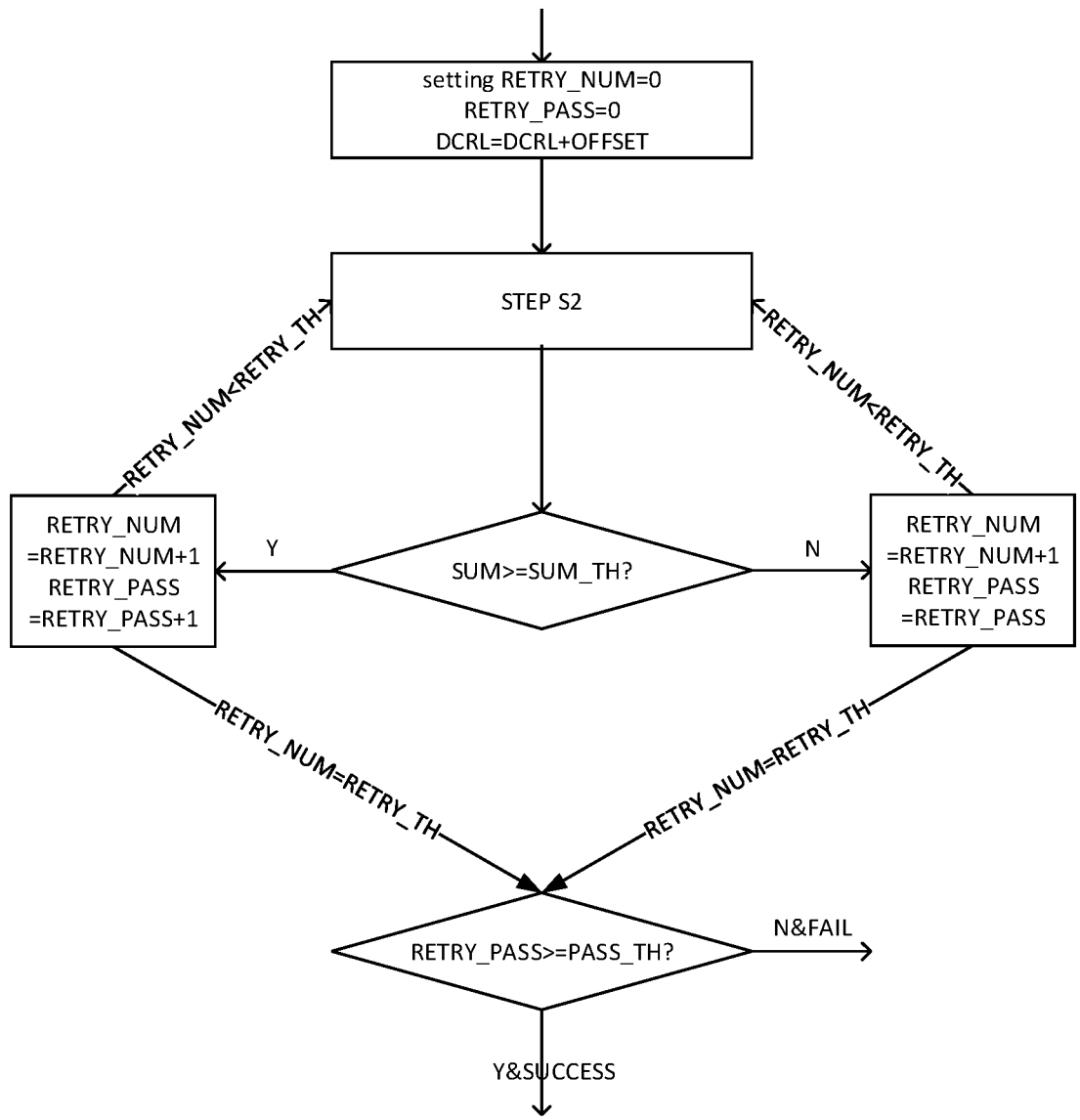
FIG. 7 is a flowchart of frequency correction in a clock and data recovery circuit of the present invention.

FIG. 7 shows a flowchart of frequency correction in a clock and data recovery circuit of the present invention. The RETRY_NUM indicates counts at error correction stages, the RETRY_PASS indicates counts success at error correction stages, the OFFSET indicates offsets of the frequency search result relative to the frequency, and the RETRY_NUM and the RETRY_PASS are initialized to zero.

In order to prevent the false locking after the frequency search in the step S2, one OFFSET, which can be configured by parameter, is required to be increased to DCRL. After that, repeat the step S2. In other words, after changing the DCRL value, perform the frequency search according to the UP/DN, namely, a process of the SUM accumulating of the frequency locking loop FLL, and then judge if the SUM at this moment is greater than or equal to the SUM_TH. If the SUM is greater than or equal to the SUM_TH, while the RETRY_NUM and the RETRY_PASS is added by 1 separately. If the SUM is smaller than the SUM_TH, the RETRY_NUM is added by 1 and the RETRY_PASS remains unchanged. Then, judge if the RETRY_NUM is less than the threshold RETRY_TH at error correction stages. If the RETRY_NUM is less than the threshold RETRY_TH at error correction stage, returning to the accumulation process of SUM in the step S2. If the RETRY_NUM is equal to the RETRY_TH, then judging if the RETRY_PASS at this moment is greater than or equal to the PASS_TH. If N&FAIL, then the previous locking in the step S2 is judged to be a false locking, and returning to the step S2, and search again after the DCRL is increased by the STEP. If Y&SUCCESS, then the locking at this moment is judged to be real, and set a FREQ_LOCK=1 at the same time.

In the step S3, the locking problem of the fractional harmonic can be solved to certain extent by introducing the OFFSET, for example, 8.4 Gbps of the input frequency is the 3/4 harmonics of 11.2 GHz clock signals. Setting a large OFFSET will result in a great frequency difference, thereby leading to a smaller period of phase difference, so that the UP and DN pulses in the same period are less, and it is more difficult to match the threshold conditions set in the step S2, which is equivalent to expanding the locking range of FLL and the usability of the circuit. Furthermore, the OFFSET can be increased or decreased, which should be specifically determined in terms of specific problems.

The present invention provide a method of frequency search and error correction in clock and data recovery circuit, which is intended to resolve wrong locking of the frequency locking loop caused by non-ideal characteristics of high-speed input data, such as jitter, noise and loss. Specifically: improving accuracy of the UP/DN pulses counting by introducing the state machine and the thresholds of various control conditions; increasing stability and reliability of the frequency locking by jumping counting sub state of the UP/DN according to the UP/DN pulse conditions; preventing the false locking and the long-term locking by introducing the state transition counter to overcome dead zone problem caused after introduction of these thresholds; introducing the repeated verification mechanism to overcome wrong judgment of the frequency search caused by random jitter; introducing the parameter OFFSET to actively change the DCO frequency one time and using the new DCO frequency point to verify whether the locking result at first stage is correct or not. With help of cooperation of these algorithm mechanisms, the frequency search and locking are correctly completed, and failure of the CDR caused by wrong locking is avoided.

Apparently, the persons skilled in the art should understand that each step of the invention mentioned above can be implemented by a universal computer. These steps can be integrated in an individual computer or be carried out by the procedure codes that can be implemented by a computer, so that they can be implemented by a computer by storing them into a storage device, or by fabricating them into various IC modules, or by fabricating more modules or steps into a single IC module. And thus, the present invention does not limit the combination of any specific hardware and software.

The information mentioned above is intended to make further detailed description and illustration for the present invention in combination with recommended embodiments, and it cannot be asserted that the specific embodiments of the present invention are limited to here, or limited to imaging requirements and specific parameters of the examples. For the ordinary persons skilled in the art of the present invention, they can perform a number of simple derivations or replacements without departing from the range and intention of the present invention, which should be regarded to be in the protection scope as defined by the Claims applied by the present invention.

What is claimed is:

1. A method of frequency search and error correction in clock and data recovery circuit, comprising the following steps:
step S1 of setting search algorithm parameters, wherein step S1 comprises: initializing frequency search algorithm parameters as the set search algorithm parameters, which includes a digital control bits DCRL used for starting search, a step size STEP used for frequency search, a transition parameter JUMP used for control condition of an internal state machine, a timer duration TIMER of a state machine, a period parameter PERIOD and an accumulation parameter SUM, wherein, the DCRL indicates digital control bits for frequency of a digital-controlled oscillator, DCO that the greater the DCRL is, the higher the clock frequency output by the DCO is, the STEP used for the frequency search indicates the DCRL value is increased by the STEP used for the frequency search when an adjustment frequency according to the increased DCRL and the TIMER of state machine is used for avoiding the false locking and the excessive locking time in the frequency locking;

step S2 of searching frequencies, wherein step S2 comprises: processing characteristic signals of frequency error, UP/DN, according to the set algorithm parameters and starting to search the frequencies, wherein, an UP Counter&Timer or a DN Counter&Timer is selected to time according to the UP/DN value, when a phase error signal transition occurs, the JUMP is increased by 1, when the JUMP is greater than or equal to a jump parameter threshold JUMP_TH, the PERIOD is increased by 1, determining whether the PERIOD is greater than or equal to a period parameter threshold P_TH, if the PERIOD is not satisfied with that the PERIOD is greater than or equal to the P_TH, another sub-state is jumped to, when the PERIOD is not equal to zero, the accumulation on UP/DN pulses is started, and continuous counts of UP/DN for a period of time is performed, NUM_DN or NUM_UP is accumulated into the SUM; if the PERIOD is greater than or equal to the P_TH, the SUM is judged; if the SUM is smaller than the accumulation parameter threshold SUM_TH, the DCRL is increased by the STEP, retesting once with a further converged frequency error; when the SUM is greater than or equal to the SUM_TH, outputting the frequency search result;

step S3 of verifying and outputting a frequency locking result, wherein S3 comprises: setting a parameter RETRY_NUM indicates counts at error correction stages, a parameter RETRY_PASS indicates counts success at error correction stages, reset DCRL value according to a set frequency offset, OFFSET, and the outputted frequency search result, performing the frequency search according to the UP/DN, restarting accumulation of the SUM, determining whether the SUM is greater than or equal to the SUM_TH, wherein, if the SUM is greater than or equal to the SUM_TH, the RETRY_NUM and the RETRY_PASS is added by 1, respectively, if the SUM is smaller than the SUM_TH, the RETRY_NUM is added by 1, and the RETRY_PASS keeps unchanged, the accumulation process of SUM in the step S2 is repeated as long as the RETRY_NUM is smaller than a threshold for counts on error correction stages, RETRY_TH; when the RETRY_NUM is equal to the RETRY_TH, determining if the current RETRY_PASS is greater than or equal to a threshold PASS_TH, wherein if the RETRY_PASS is less than the PASS_TH, the previous locking at S2 can be determined as the false locking; and then returning to the step S2 and search again after DCRL is increased by STEP, wherein, if the RETRY_PASS is greater than or equal to the PASS_TH, the locking at this moment is the real frequency locking and the frequency locking result is outputted;

wherein, the UP/DN is be acquired by following methods: using clocks CLK0/1/2/3 to sample a data edge or a data center of an input data DIP/DIN to acquire a corresponding sampling result Edge0, Data0, Edge1 and Data 1, and carrying out an exclusive-or operation on synchronized above sampling results to acquire the UP/DN.

2. The method of frequency search and error correction in clock and data recovery circuit of claim 1, wherein:
if value of the Data 0 is different from that of the Edge 1, and value of the Edge 1 is the same as that of the Data 1, a high-level UP signal and a low-level DN signal are output; if value of the Data 0 is the same as that of the Edge 1 and value of the Edge 1 is different from that of the Data 1, a low-level UP signal and a high-level DN signal are output.

3. The method of frequency search and error correction in clock and data recovery circuit of claim 1, wherein:
in the step S2, a phase error signal transition is determined by transitioning from UP/DN with continuous pulse to DN/UP with continuous pulse or transitioning from DN/UP with continuous low level to UP/DN with continuous low level, or according to change of the relative number of the UP/DN pulses in the UP/DN data.

4. The method of frequency search and error correction in clock and data recovery circuit of claim 1, wherein:
in the step S2, when the PERIOD is greater than or equal to the P_TH, the SUM is judged; when the SUM is smaller than the SUM_TH, the DCRL value is increased by the STEP, when the PERIOD is greater than or equal to the P_TH, while the SUM is greater than or equal to the SUM_TH, outputting the frequency search result.

5. The method of frequency search and error correction in clock and data recovery circuit of claim 1, wherein:
in the step S2, a state transition counter is comprised, the state transition counter starts to count after transitioning to another sub-state, the sub-state is forced to transition once time if timeout, meanwhile the PERIOD is increased once, or the sub-state is not forced to transition, only the PERIOD is increased once.

6. The method of frequency search and error correction in clock and data recovery circuit of claim 1, wherein:
in the step S3, the OFFSET is increased or decreased according to the output frequency search result, thereby obtaining the DCRL.

* * * * *